United States Patent [19]

Jakobsen et al.

[11] Patent Number: 5,591,679

[45] Date of Patent: Jan. 7, 1997

[54] SEALED CAVITY ARRANGEMENT METHOD

[75] Inventors: Henrik Jakobsen; Terje Kvisterøy, both of Horten, Norway

[73] Assignee: Sensonor A/S, Horten, Norway

[21] Appl. No.: 593,848

[22] Filed: Jan. 30, 1996

Related U.S. Application Data

[62] Division of Ser. No. 421,665, Apr. 12, 1995.

[51] Int. Cl.[6] .............................. H01L 21/77; H01L 21/78
[52] U.S. Cl. .............................. 437/228; 437/7; 437/901; 148/DIG. 12
[58] Field of Search .................................... 437/228 SEN, 437/7, 901, 974; 148/DIG. 12, DIG. 73

[56] References Cited

U.S. PATENT DOCUMENTS

| | | | |
|---|---|---|---|
| 4,023,562 | 5/1977 | Hynecek et al. | 437/215 |
| 4,291,293 | 9/1981 | Yamada et al. | 257/419 |
| 4,295,115 | 10/1981 | Takahashi et al. | 148/DIG. 12 |
| 4,670,969 | 6/1987 | Yamada et al. | 148/DIG. 12 |
| 4,802,952 | 2/1989 | Kobori et al. | 257/417 |
| 4,975,390 | 12/1990 | Fujii et al. | 437/228 SEN |

*Primary Examiner*—T. N. Quach
*Assistant Examiner*—Michael Trinh
*Attorney, Agent, or Firm*—Rodman & Rodman

[57] ABSTRACT

This invention relates to a method for making sealed cavities on silicon wafer surfaces by anodic bonding and with electrically insulated conductors through the sealing areas to connect functional devices inside the cavities to electrical terminals outside said cavities. Said conductors are provided by the use of doped buried crossings in a single crystal silicon substrate, thereby also allowing different kinds of integrated silicon devices, e.g. sensors to be made. Further, the invention relates to a device made by the novel method.

18 Claims, 10 Drawing Sheets

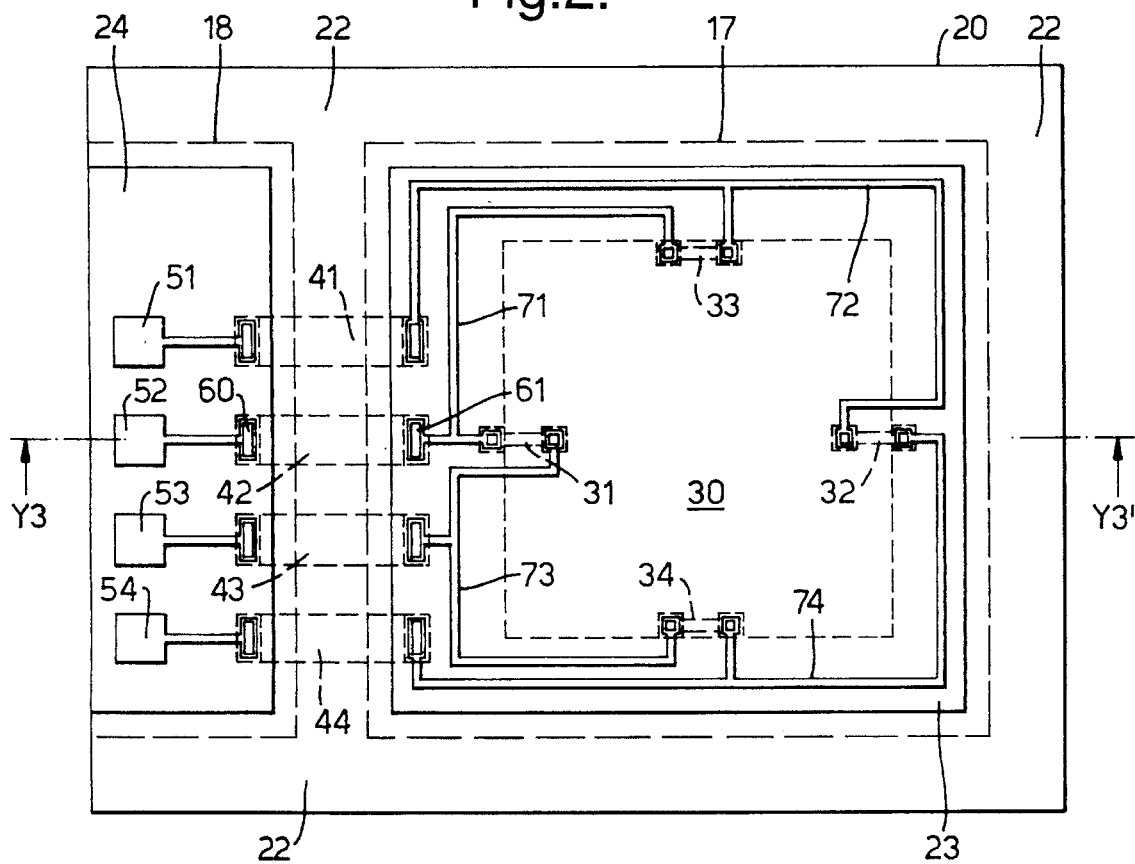
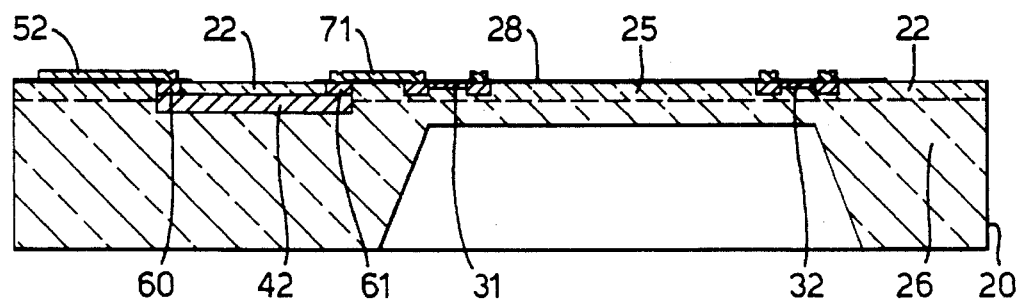

SEALED CAVITY ARRANGEMENT METHOD

This is a division of application Ser. No. 08/421,665 filed Apr. 12, 1995, pending.

BACKGROUND OF THE INVENTION

1. Field of the Invention

This invention relates to a method for making sealed cavities on silicon wafer surfaces with electrically insulated conductors through sealing areas to connect functional devices inside the cavities electrically to electrical terminals outside said cavities. This method of making sealed cavities can be performed on wafer level to meet requirements for low-cost batch processing. The method is in particular well suited for building silicon sensors such as pressure sensors which include reference volumes with controlled atmosphere or vacuum and sensors which include vibrating resonating structures with vacuum reference volumes as an integral part of the die structure, as well as force sensors such as accelerometers which include features such as mechanical overload protection and squeeze film damping. The method also provides a good alternative for micropackages on the chip level for the protection of delicate structures such as surface micromachined structures, against the environment, thereby allowing low-cost plastic packaging to be used instead of expensive metal or ceramic packages.

The invention also relates to a sealed cavity device made by the inventive method.

2. Description of Related Prior Art

Silicon microsensors and microsystems are of increasing importance and will be subject to fast growth. Silicon pressure sensors are already elements of important industrial production and new types of sensors such as silicon accelerometers and silicon flow sensors are now subject to a growing market. Within the area of microactuators ink jet nozzles, fuel injection nozzles and micropumps built from single crystal silicon are already on the market. In the future many new products will be developed and brought on the market not only within the field of sensors and microactuators, but also complete microsystems with sensors, microactuators and electronics on the same single silicon chip will soon be a reality. A limiting technological factor for industrial growth within this field of technology is the complexity and high costs related to sensor assembly and packaging technology. It is the view of the inventors that new methods for assembly of such true 3-dimensional structures will be needed. Such assembly methods should be performed on the wafer level to reduce assembly and packaging cost and should result in high reliability devices and microsystems. Methods to provide sealed cavities on a surface of silicon and with electrical connections extending over the sealing area for connecting functional devices inside the cavity with the outside is today very limited. New methods are therefore needed for high-reliability and high accuracy sensors such as absolute pressure sensors, microaccelerometers and devices that are using resonant structures with high Q-factor. An overview of methods for micromachining of three dimensional structures in silicon is given by Kendall et. al: "Critical Technologies for the Micromachining of Silicon"; Semiconductors and Semimetals, Vol 1.37 (1992).

Below is a discussion of some important industrial prior art processes and methods that are available for sealing wafers together, in the following referred to as wafer lamination processes.

Eutectic bonding by the use of gold-silicon is a well known method that has been used for assembly of silicon dies for many years. The method has also been tried for silicon to silicon wafer bonding by using a deposited thin gold film on the surface of one of the wafers, but this method suffer from the following important drawbacks. A first limitation is due to the fact that gold is a fast diffuser in silicon and the method can therefor not be used in areas of PN-junctions at or near the surface since the penetration of gold will cause electrical shorts and high leakage currents between conductors. A second limitation is due to the large differences in thermal expansion coefficient, viz. $13 \times 10{-6}$ ppm/degC. for eutectic gold-silicon and $2.6 \times 10{-6}$ ppm/degC. for silicon, yielding high stress in the seal. A third drawback is due to the fact that gold-silicon eutectic bonding is very sensitive to the thin native oxides that always are present on silicon surfaces, thus, necessitating scrubbing action to make the eutectic melt to form and making complete sealing over large areas difficult.

Soldering is also used for assembly of silicon dice to silicon or other materials to make sensors as described by Yamada el. al. in U.S. Pat. No. 4,023,562. Such a process may be used to assemble parts together on the die level, but is difficult to control as a high yield process for assembly of all the dice on a wafer on the wafer level due to difficulties in obtaining uniform soldering of fine patterns over large areas. Yamada et. al. use Au—Sn eutectic solder. Another disadvantage of this prior art method is the high built-in stress due to the use of a brittle hard solder material with a large difference between thermal expansion $16 \times 10{-6}$ ppm/degC. for Au—Sn and $2.6 \times 10{-6}$ ppm/degC. for silicon.

Another method that has been used for many years is the use of glass as sealing material to seal silicon to silicon, including glasses that can be printed in the form of a paste. An example of such prior art is European patent publication 0127176. The use of this prior art method has so far mainly been limited to back-side sealing only where no electrical connections are present and needed.

Anodic bonding of glass to silicon is a method of increasing use for wafer bonding and wafer lamination by the use a glass with a thermal expansion coefficient well matched to that of silicon. Examples of such glasses are Pyrex 7740 from Corning, TEMPAX from Schott/DESAG and SD2 from Hoya. An overview of anodic bonding as method is given by K. B. Albaugh and P. E. Cade: "Mechanism of Anodic Bonding of Silicon to Pyrex Glass"; Tech. Digest, IEEE Solid State Sensor and Actuator Workshop, Hilton Head Island, S.C., 1988, p. 109 and by Bengtson: "Semiconductor Wafer Bonding: A Review of Interfacial Properties and Applications"; Journal of Electronic Materials, Vol. 21, No. 8, 1992 pp. 841–862. A good example of the prior art relating to how anodic bondable glass substrates are used to make pressure sensors is described by Yamada et. al. in European Patent Publication 0127176, according to which pyrex substrate is bonded to the unpatterned back-side of a pressure sensor for a support and pressure inlet function and not in the area of the silicon with electrically active parts and PN-junctions. This method is also used to form vacuum reference volumes under the silicon diaphragm on the side opposite to the side of the silicon chip containing electrical connections. Anodic bonding can also be performed by the use of sputtered thin glass films deposited on a silicon substrate. This method is described by Hanneborg et. al: "Anodic Bonding of Silicon Chips Using Sputter-deposited Pyrex 7740 Thin Films"; Proceeding of the 12.th Nordic Semiconductor Meeting, Jevnaker, June 8–11, pp. 290–293, ISBN 82-7267-858-6. Silicon-to silicon assemblies by using sputtered pyrex films are characterized by very low built-in stress resulting in sensors of very good long-term stability as described by Hanneborg et. al.: "An Integrated Capacitive Pressure Sensor with Frequency Output"; Sensors and Actuators, 9 (1986) pp. 345–361 and by Holm et. al.: "Stability and Common Mode Sensitivity of Piezoresistive Silicon Pressure Sensors made by different Mounting Methods"; Digest of Technical Papers of Transducers '91, San-Francisco, pp. 978–991. Anodic bonding is also demonstrated for vacuum packaging of microsensors by Henmi et. al.: "Vacuum Packaging for Microsensors by Glass-Silicon Anodic Bonding"; Proceeding from The 7th International Conference on Solid-State Sensors and Actuators, pp. 584–587.

A method of building sealed cavity structures in pressure sensors is presented by Yamada et. al. in U.S. Pat. No. 4,291,293 where a glass cover is sealed against a thin poly-silicon film in the surface area of the silicon chip that includes diffused crossing conductors on the silicon surface and with passivation between the single crystal silicon surface and the poly-silicon film in the sealing area. The inventors herein have, however, recognized the following limitations and drawbacks of this prior art. Anodic bonding to poly-silicon surfaces is difficult on large areas due to the surface roughness and inclusions that is common for poly-silicon films, thus making the method more suitable for anodic bonding on the die level rather than on the wafer level. Another important technological problem with this prior art method is the difficulty of avoiding mobile ions from the anodic bonding glass to drift through the poly-silicon film and into the passivating film at the bonding temperature, thereby causing electrical instability and reliability problems. This problem of prior art is illustrated in FIG. 1(a) and 1(b). FIG. 1(a) shows a small cross-sectional part of the sealing area of the prior art according to U.S. Pat. No. 4,291,293 before the sealing of the glass and shows the poly-silicon layer 424 on top of the passivation 423 and with one diffused P-type crossing conductor 442 and with the insulating space-charge region 440 of the pn-junction 443 extending into the p-side to the line 444 and into the N-type substrate area 426 to line 445. With no ions in the passivating film 423 the space-charge region 440 will extend with uniform thickness all around the p-conductor including the surface area. FIG. 1(b) shows the same structure after anodic bonding with the glass 415 bonded to the surface of the poly-silicon layer 424. During the anodic bonding process that takes place at about 300–450 degC., sodium ions Na+ drift from the glass through the poly-silicon film 424 and into the passivation layer 423. An accumulation layer of electrons 446 will form on the surface of the lightly doped N-type silicon part 426 leading to a reduction in the width of the insulating space-charge region 440 at the surface 447, thereby resulting in a reduction in insulation-to-withstand-voltage and electrical break-down of the junction will thus occur at a reduced voltage. Such effects may lead to non-functional devices after anodic bonding turning out as a yield problem, and this effect may also cause destructive failures during operation in the field due to the mobile nature of the Na+ ions in the passivation. Ionic contamination in the passivation over PN-junctions may not only lead to reduction in break-down voltages and cause leakages currents, but may also cause N-type inversion layers to be formed on lightly doped P-type areas between doped N-areas that should be insulated from each other. Such effects are well known for persons with knowledge in the field of semiconductor physics and are among others described in a semiconductor textbook by A. S. Grove: "Physics and Technology of Semiconductor Devices", Chapter 10, 11 and 12; John Wiley & Sons, Inc. (1967).

SUMMARY OF THE INVENTION

It is an object of the invention to overcome the limitations and problems of the methods provided by the prior art by developing a method of wafer lamination by bonding a first silicon wafer to a second glass substrate wafer and/or a first silicon wafer to a second silicon wafer with a sputtered glass film on the surface by anodic bonding, this method of bonding to be performed on the wafer level allowing sealed cavity structures to be built for each individual die of the laminated wafers and that includes high-reliability electrically insulated feed-throughs between electrically operative functional devices inside of the cavities and electrical connection areas outside of the sealing area and the cavity. This is accomplished by means of the method according to the present invention as defined in the attached patent claims, as well as in the description below with reference to the attached drawing figures showing non-limitative, preferred embodiments of the invention. Further the inventive sealed cavity device is defined in the attached patent claims, as well as in the description below with reference to the drawings showing non-limitative examples according to the invention.

The invention provides for different kinds of sensors requiring sealed cavities including electrical feed-throughs on each die to be built in a cost effective way as described and shown in detail in the following.

The method is in particular suitable for making absolute pressure sensors with vacuum in the sealed cavity, accelerometers with controlled pressure in the area around a seismic mass-spring system and sealed cavities with controlled pressure for resonant structures and other types of functional devices. The method may also be used to build micropackages on the chip level around delicate structures that need to be protected against the environment such as different types of microactuators, hereby allowing low-cost plastic packaging to be used.

BRIEF DESCRIPTION OF THE DRAWING

FIG. 2 is a plan view of a surface of a silicon part of a piezoresistive pressure sensor with silicon diaphragm built with buried conductors and a bare silicon surface sealing area formed on the surface built by using the method according to the invention.

FIG. 3 is a cross sectional view through the structure of FIG. 2 along line $Y_3$–$Y_3$'.

DETAILED DESCRIPTION OF THE INVENTION

Figure 4:
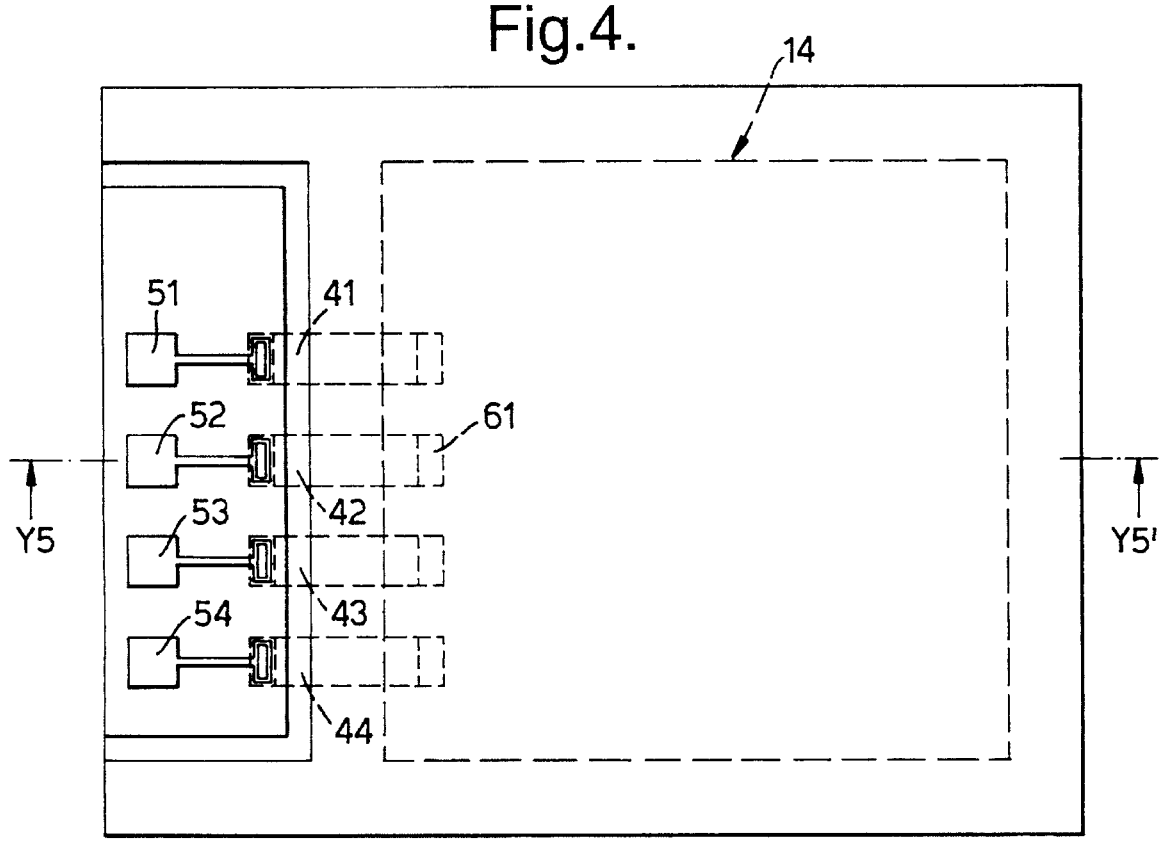
FIG. 4 is a plan view of the surface of a piezoresisitve silicon pressure sensor die sandwich with vacuum reference volume formed as an integral part of the sensor die sandwich built with buried conductors and glass cover with vacuum cavity sealed to the bare silicon surface by using the method according to the invention.
Figure 5:
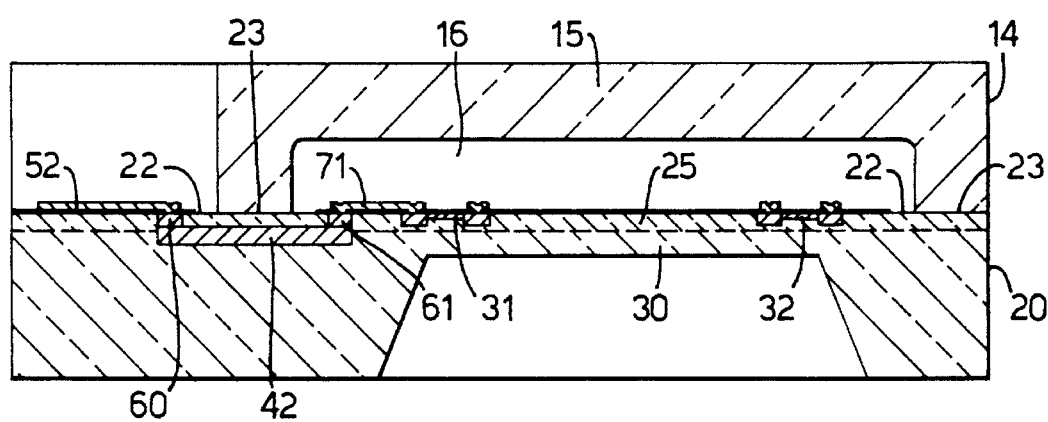
FIG. 5 is a cross sectional view through the structure of FIG. 4 along line $Y_5$—$Y_5$.
Figure 6:
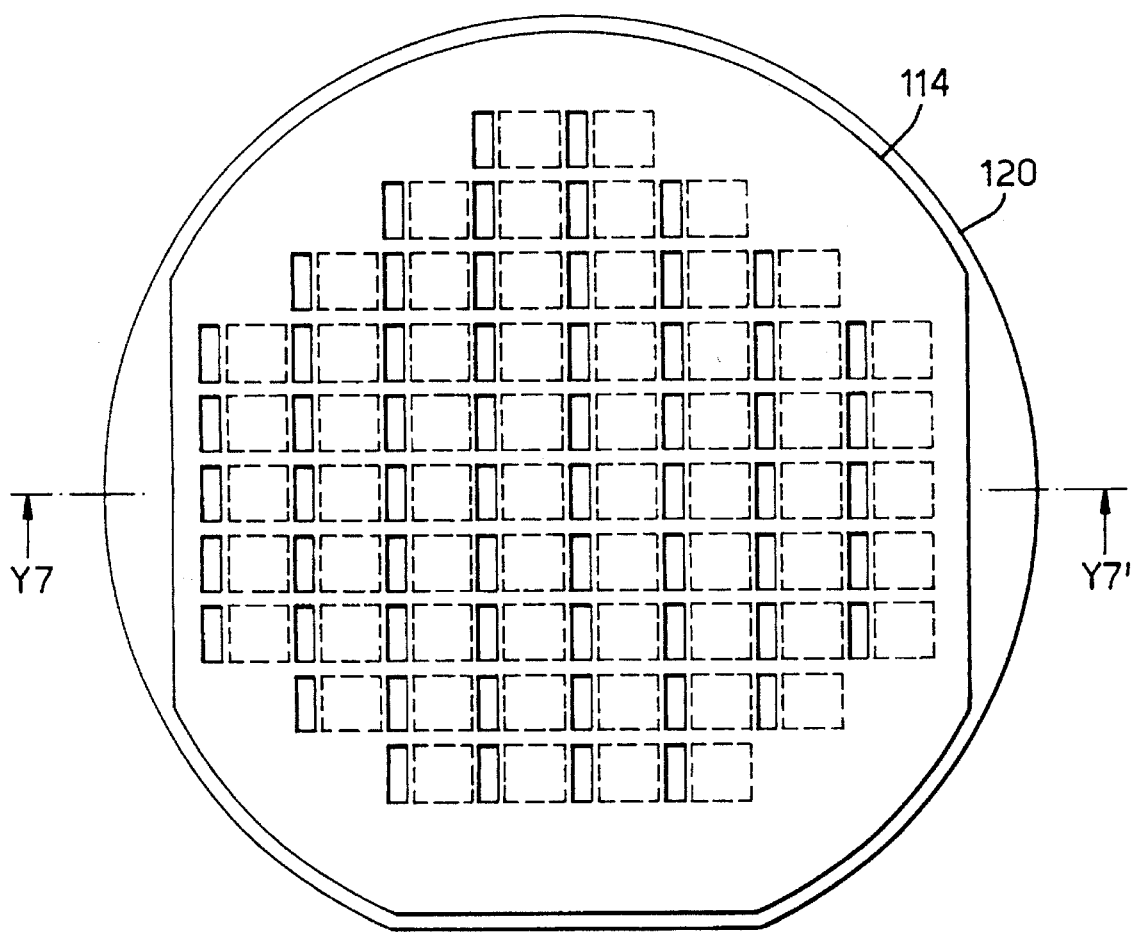
FIG. 6 is a surface view of a micromachined glass substrate bonded to a silicon substrate by anodic bonding and with a multiple of pressure sensor dies with vacuum reference volumes and bonding areas formed on wafer.
Figure 7:
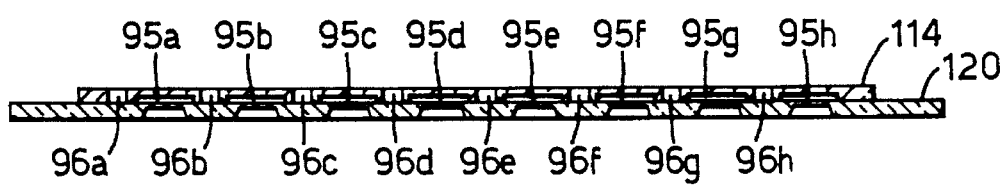
FIG. 7 is a cross sectional view through the structure of FIG. 6 along line Y7–Y7'.
Figure 8A:
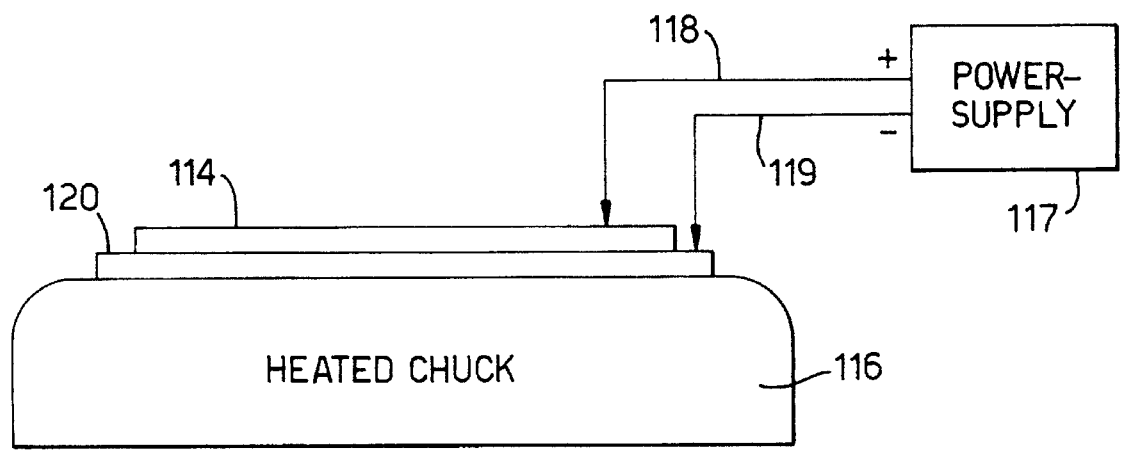
FIG. 8a shows the principle of the anodic bonding process in cross section and FIG. 8b shows the principle in plan view.
Figure 8B:
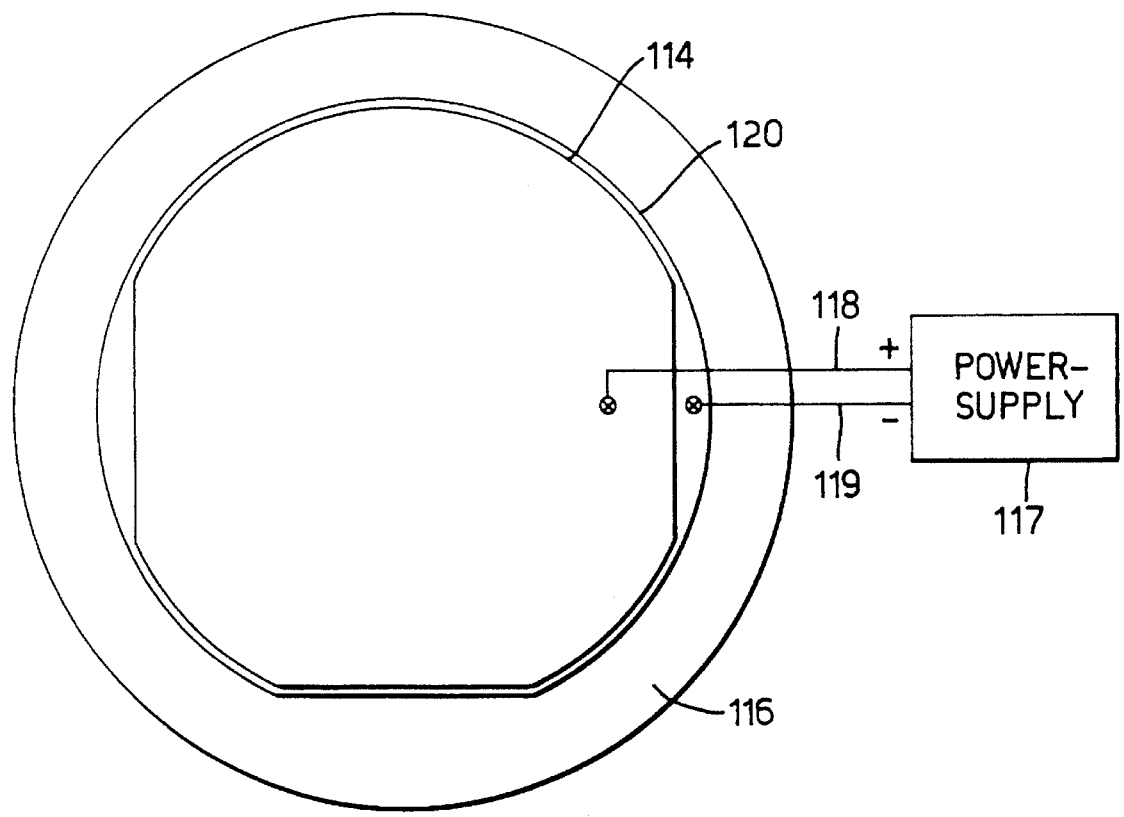

The novel method according to the invention will now be described with reference to a pressure sensor made with this new art by referring to FIGS. 2, 3, 4, 5, 6, 7 and 8. FIG. 3 shows a cross-sectional view of one pressure sensor die 20 of a first silicon wafer 120 according to FIGS. 6, 7 and 8 including a pressure sensitive diaphragm 30 with four piezoresistors. FIG. 2 is a plan view of the same die 20. Said piezoresistors 31, 32, 33 and 34 are electrically connected to aluminium wire bonding pads for interconnection areas 51, 52, 53 and 54 via aluminium interconnection lines 71, 72, 73 and 74 and buried diffused conductors 41, 42, 43 and 44. These conductors, typically of P-type, are doped by ion implantation and buried under an N-type epitaxial layer 25 which also covers the N-type substrate 26. The method of making these buried conductors results in no steps on the surface of the first silicon wafer hereby taking advantage of the very smooth surfaces of polished silicon wafers in the sealing area of the structure to be made. This result in a reliable wafer lamination method with high yield and allowing high reliability sensors or functional devices to be made with low built-in stress as the sealing areas. The area on the surface of the die marked 22 is the area on which anodic bonding is to be performed, the line 17 indicating the periphery of the cavity of the glass and line 18 indicating the periphery of the via-hole of the glass needed for access to the aluminium wire-bonding and interconnection areas 51, 52, 53 and 54. The buried conductors are connected to the aluminium interconnection areas and lines via contact diffusions 60, 61 and contact holes in the passivation 28 as shown in the cross sectional view of FIG. 3 where one buried is diffused conductor 42 is contacted by P+ diffusions 60 and 61 at each end through the epitaxial layer 25. FIGS. 4 and 5 show the silicon die 20 of FIGS. 2 and 3 after anodic bonding to a glass member 14, the silicon die 20 being part of said first silicon wafer 120 and the glass member 14 being part of a second wafer of glass 114 as shown in FIGS. 6, 7 and 8. The glass member 14 of FIGS. 4 and 5 has a section 15 forming a recess in said glass member 14 and thus forming a sealed cavity 16 with a sealing interface area 23 bonding to the silicon member 20 after anodic bonding. By referring to FIG. 5 it is possible to follow the electrical connection path from one of the outside wire bonding areas, e.g. area 52, via a first contact diffusion 60 down to the buried conductor 42 which crosses below the sealing area 23 of the cavity 16, and via a second contact diffusion 61 to a second aluminium interconnection line 71 which establishes connections to the two piezoresistors 31 and 33.

The anodic bonding process itself is well known to persons working in the field of silicon microsensors and will not be described in any detail here. However, the principle will be briefly discussed with reference to FIGS. 8(a) and 8(b). The multichip silicon wafer 120 is placed together with the glass wafer 114 on a heated chuck 116 after the wafers are well aligned and placed in contact with each other. When the two-wafer structure is heated to a temperature in the range 300 to 450 degC. positive ions such as sodium ions in the glass will be mobile and will drift under the influence of an electric field by enforcing a voltage from a power supply 117 over the glass via the electrical connections and probes 118 and 119. The positive ions in the glass 114 will drift towards the interface at the silicon wafer 120, thus building up an electric field over the interface region, and thereby also creating an electrostatic force which pulls the two wafers 114 and 120 together to atomic level intimate contact. After cooling down to room temperature the ions are "freezing" and will not be mobile any more, but the electrostatic force will partly remain and hold the two wafers together in atomic contact with a high and lasting bond strength. This will result in a glass substrate with cavities 95a to 95h and through-holes 96a to 96h bonded to a silicon wafer with etched diaphragms as shown in FIGS. 6 and 7, where FIG. 7 is a cross-sectional view through the structure of FIG. 6 marked by cross-section line Y7–Y7'.

Figure 1A:
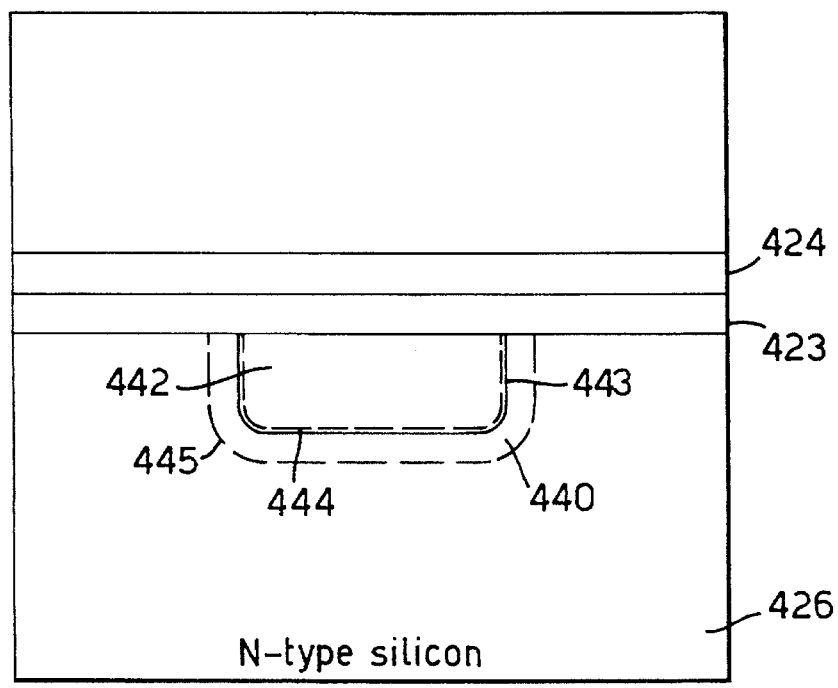
FIG. 1 illustrates important ion contamination problems related to prior art when using surface conductors for crossing a sealing area as taught by U.S. Pat. No. 4,291,293.
Figure 1B:
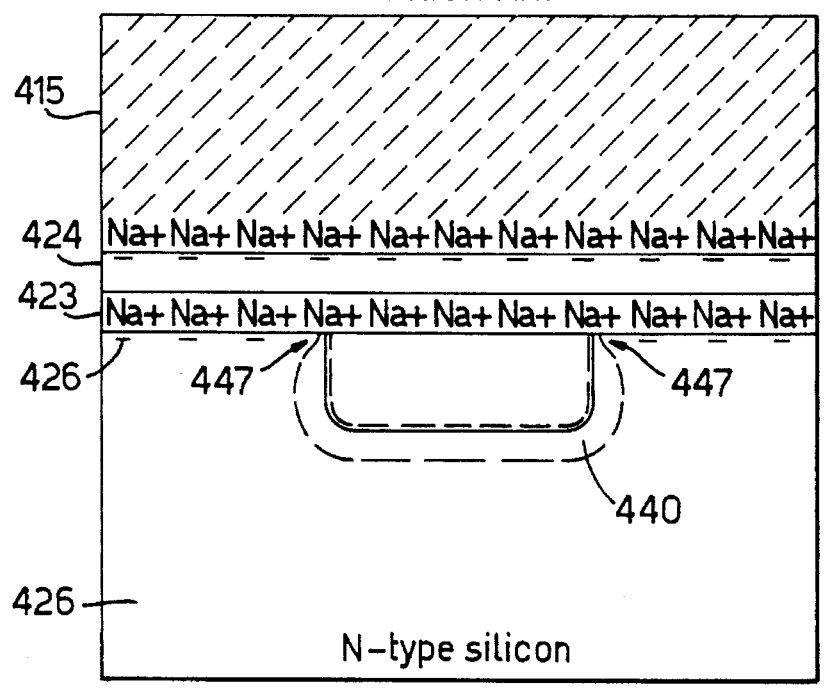
Figure 9A:
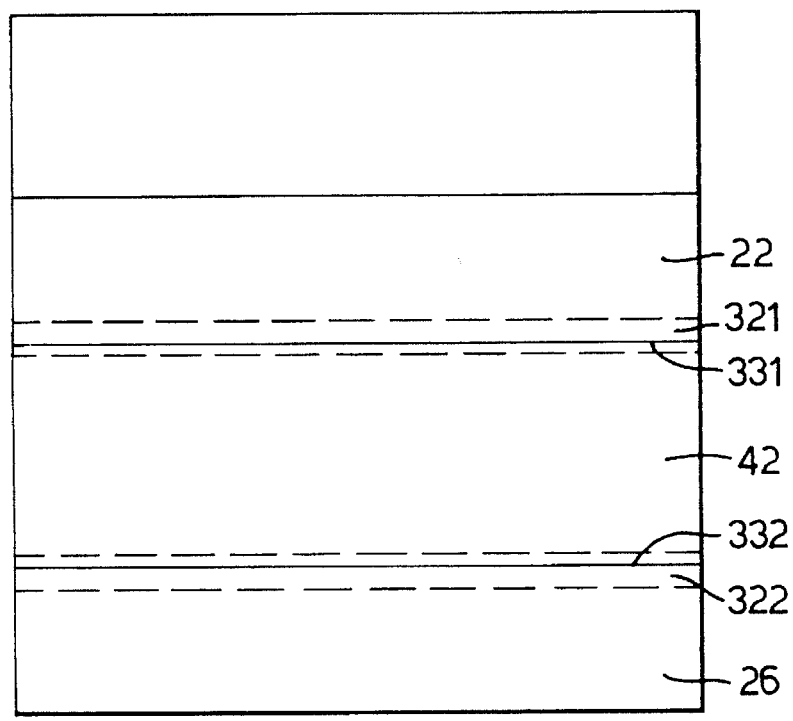
FIG. 9 is a cross-sectional detail of the sealing area according to the invention showing the elimination of any effects from the ions which take part in the anodic bonding process at the insulating space-charge region of the crossing conductors, FIG. 9a showing the structure before anodic bonding and FIG. 9b showing the structure after anodic bonding.
Figure 9B:
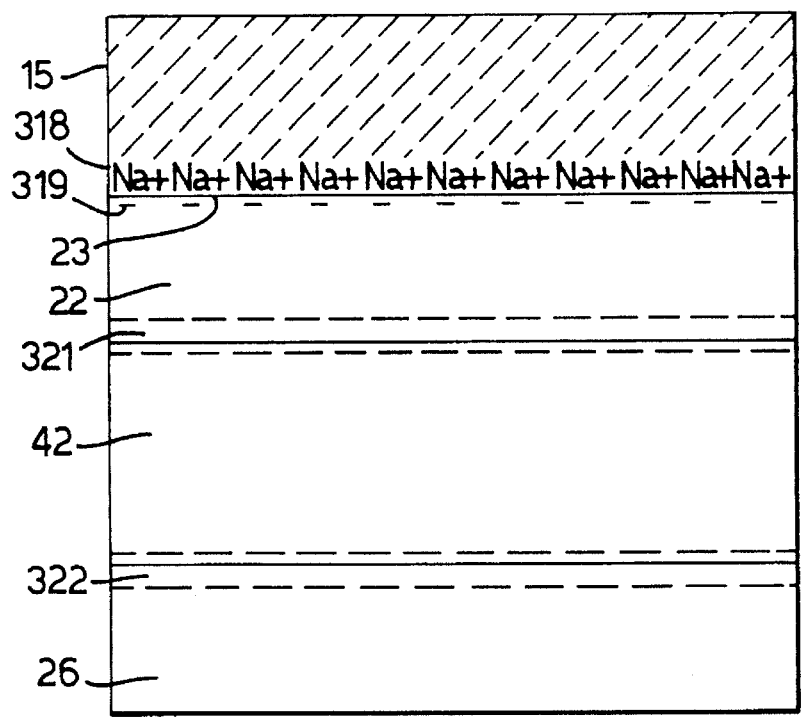

The method according to the invention completely solves the problems related to the prior art of forming accumulation layers and/or inversion layers which affect the insulating PN-junction of the conductors. The use of buried conductors isolates the PN-junction of each of the buried conductors under the epitaxial layer and away from the influence of the ions from the glass. The ions from the glass will have an effect on the surface of the epitaxial layer only where no PN-junctions are located. This can be seen in FIG. 9(a) and FIG. 9(b) showing a small cross-sectional portion from the sealing area of the structure of FIG. 3 and FIG. 5, where FIG. 9(a) shows a detailed structure before anodic bonding as seen from FIG. 32 and FIG. 9(b) showing a detailed structure after anodic bonding as seen from FIG. 5. It can be seen from FIG. 9(b) that the positive ions, first of all sodium Na+ ions 318 in the glass 15 at the interface 23 to the silicon will cause an accumulation layer of electrons 319 to be formed at the surface of the N-type epitaxial layer 22 and will not at all affect the crossing conductor insulating space-charge regions 321 around the PN-junction 331 and space-charge region 322 around the PN-junction 332 of the buried P-type conductor 42. This is contrary to the method of prior art with surface conductors as described earlier and shown in FIG. 1 where the insulating PN-junction of the P-type conductors will be made more narrow when the same accumulation layer in the N-area is formed, leading to a reduction in the width of the surface space-charge region and thereby an uncontrolled reduction of the insulation voltage rating at this junction.

Figure 10A:
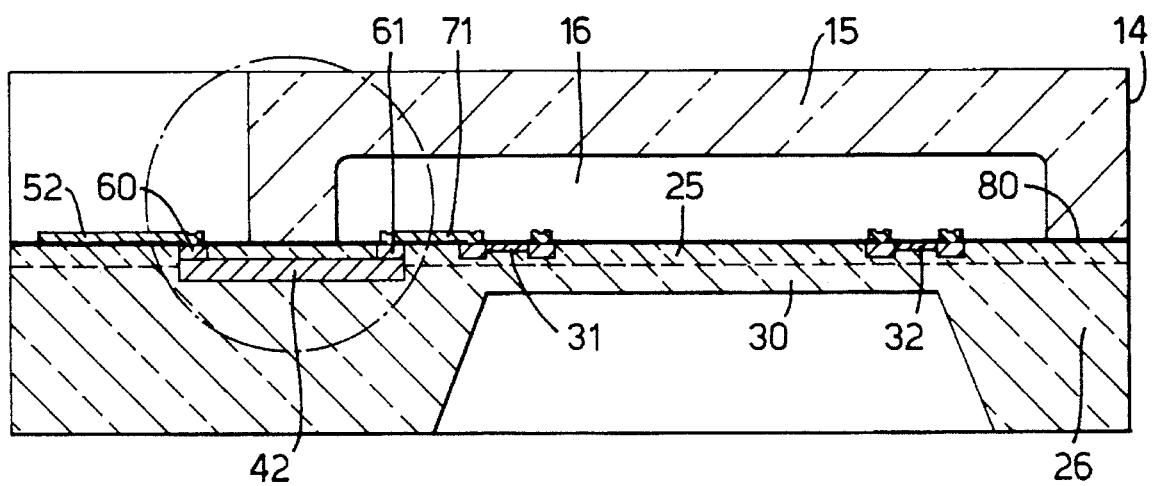
FIGS. 10a and 10b are cross-sectional views of a piezoresisitve silicon pressure sensor die sandwich structure with vacuum reference volume formed as an integral part of the sensor die sandwich structure built with buried conductors and glass cover with vacuum cavity sealed to a passivated silicon surface by using the method according to the invention.
Figure 10B:
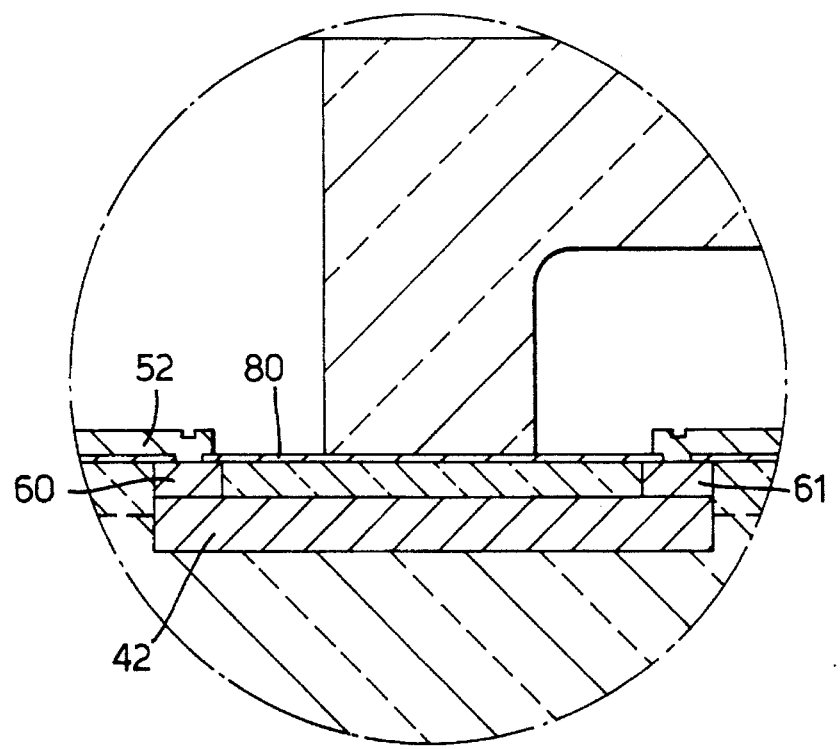

In the following there is now to be explained some variations within the frame of this invention. The wafer lamination by anodic bonding as explained and shown in FIGS. 2, 3, 4 and 5 is performed against a bare silicon surface 23 in the sealing area. It is known that anodic bonding can also be done directly on a thin passivating film such as silicon dioxide and/or silicon nitride on the surface of the first silicon wafer 120 as shown in FIGS. 10(a)–(b) showing bonding of the glass member 14 to a passivation film 80 of the silicon member 20.

Figure 11A:
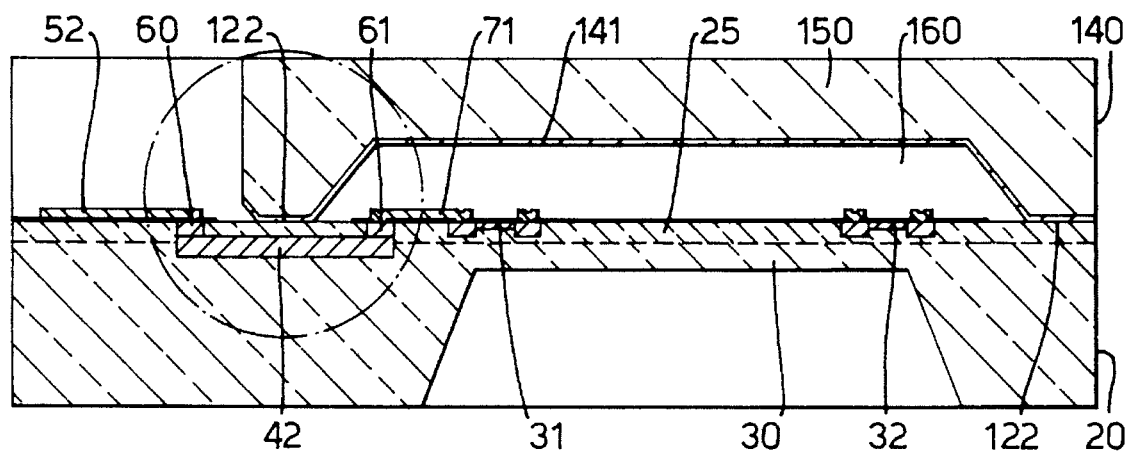
FIGS. 11a and 11b are cross-sectional views of a piezoresisitve silicon pressure sensor die sandwich structure with vacuum reference volume formed as an integral part of the sensor die sandwich structure built with buried conductors and with a silicon cover with vacuum cavity and sealed to a bare silicon surface by using anodic bonding and a sputtered glass layer.
Figure 11B:
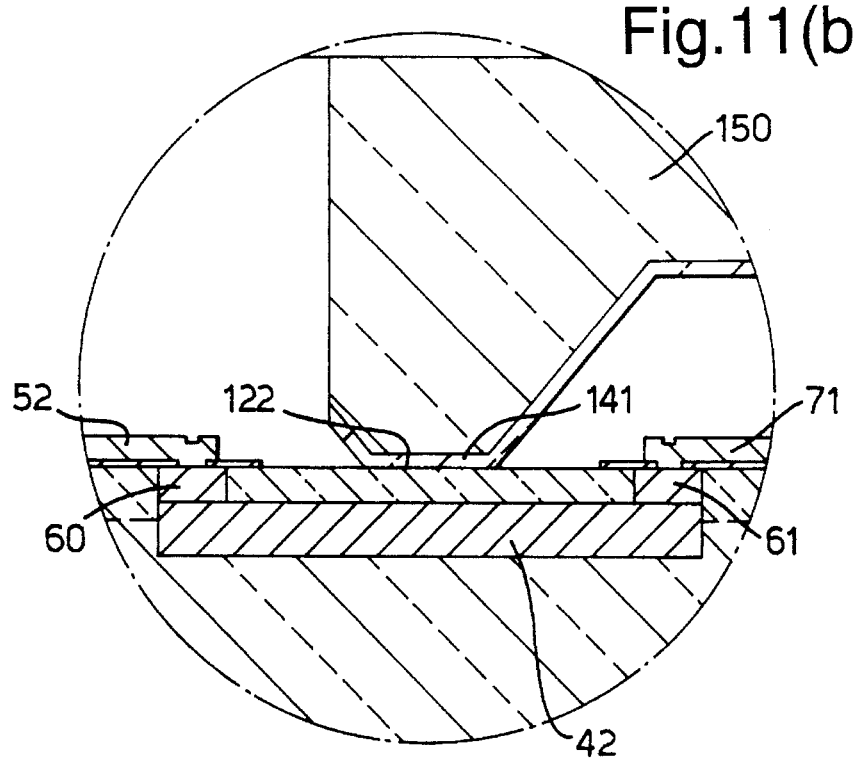

The glass wafer 114 of FIG. 7 can be replaced by a second silicon wafer with sputter deposited glass film on one of the surfaces. FIGS. 11(a)–(b) shows a cross sectional view of this resulting structure with 140 being the second silicon member with the sputter deposited glass film 141 bonded to the first silicon member 20 forming a complete seal at area 122 over the crossing conductors 42. A vacuum reference volume 160 is in this case made by selective etching of a hole in a region 150 of the second silicon member 140.

Figure 12A:
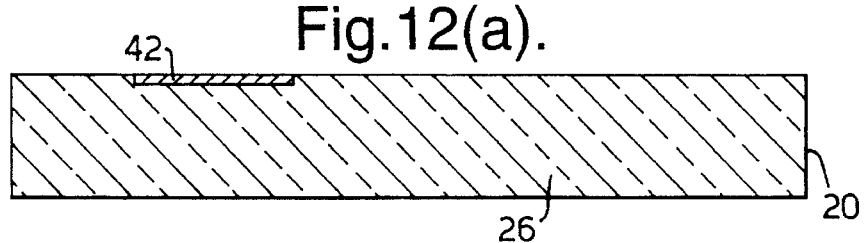
FIGS. 12(a)–(e) show the production steps that is used to manufacture the silicon wafer of a piezoresistive pressure sensor built with buried conductors as shown in FIG. 2 and FIG. 3 to make possible the for forming of the pressure sensor structure with sealed vacuum reference volume as shown in FIGS. 4 and 5.
Figure 12B:
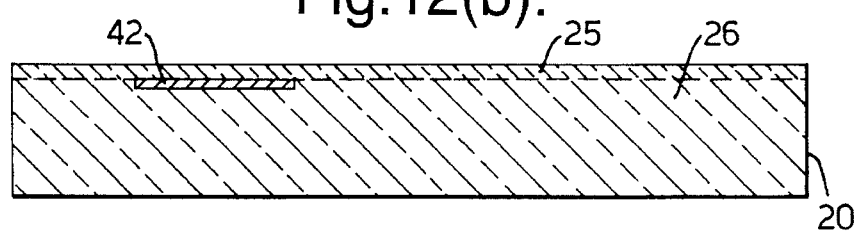
Figure 12C:
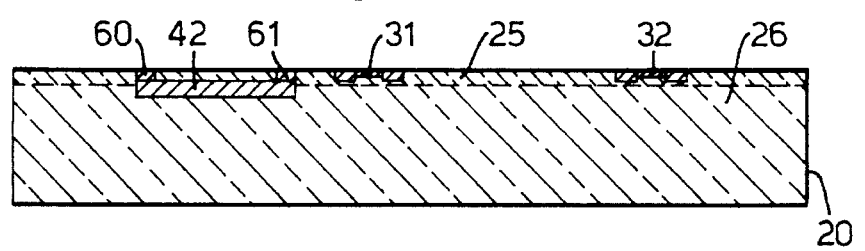
Figure 12D:
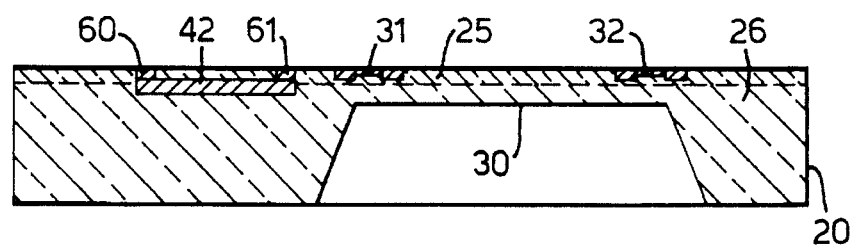
Figure 12E:
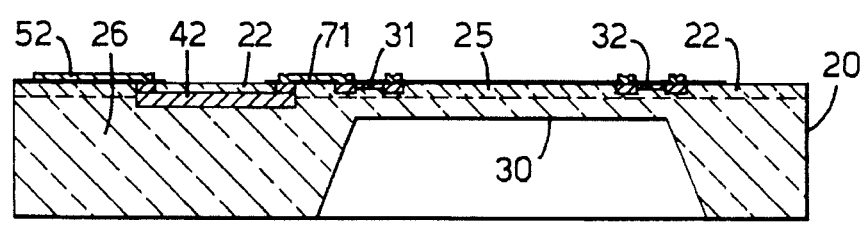

The first multi-chip silicon wafer 120 of FIG. 7 with pressure sensor die 20 as shown in FIG. 3 can be processed by well known silicon process technology as explained in the following by referring to FIGS. 12(a)–(e). Processing starts as shown in FIG. 12(a) with an N-type 1-0-0 single crystal substrate 26. The first photomask step defines the buried conductors 42 which are formed by ion implantation of boron using a photoresist as a mask layer and followed by a drive-in diffusion step. This will result in surface doping of insulated P-areas for the crossings without any steps in the surface at the location of the PN-junctions. This is followed by growing an epitaxial N-type layer 25 as shown in FIG. 12(b), thereby making the conductor 42 buried into single crystal silicon well protected from surface effects. The next two steps as shown in FIG. 12(c) are to form the P-type contacts 60 and 61 at each end of the buried P-type conductor 42 by photomasking and doping and followed by patterning and doping the piezoresistive elements 31 and 32. Over the contacts 60, 61 and elements 31 and 32 is provided a passivation layer 28. The structure can now be completed by forming a diaphragm 30 by selective etching as shown in FIG. 12(d) and by making contact holes through the passivation layer 28 and metal interconnection members 52 and 71 as shown in FIG. 12(e). The structure is now ready to be anodically bonded to a glass member as shown in FIG. 5 or a second silicon member with sputtered glass as shown in FIG. 11.

Figure 13:
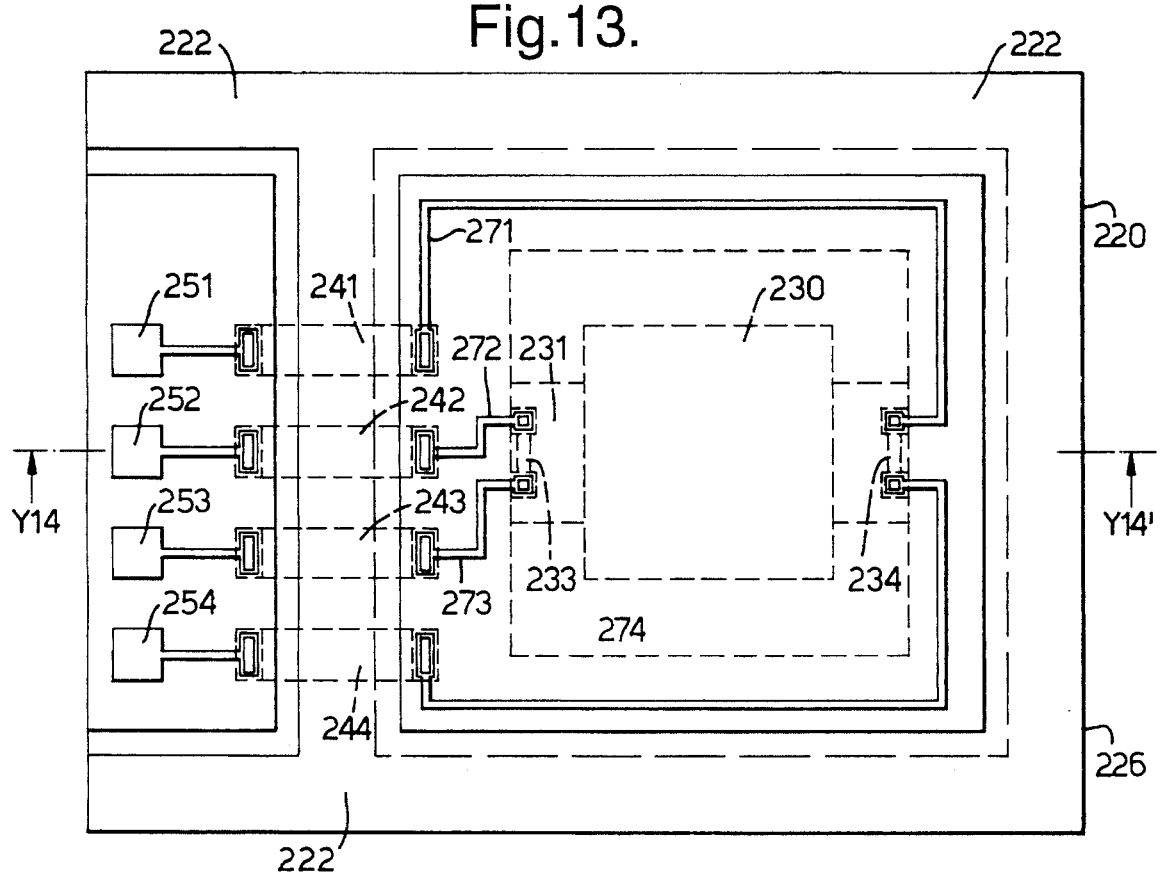
FIG. 13 shows in plan view a piezoresistive accelerometer with a sealed cavity formed around the seismic mass-spring system formed by anodic bonding of two glass substrates, one on each side of the silicon part and with buried conductors crossing the sealing area of the silicon part.
Figure 14:
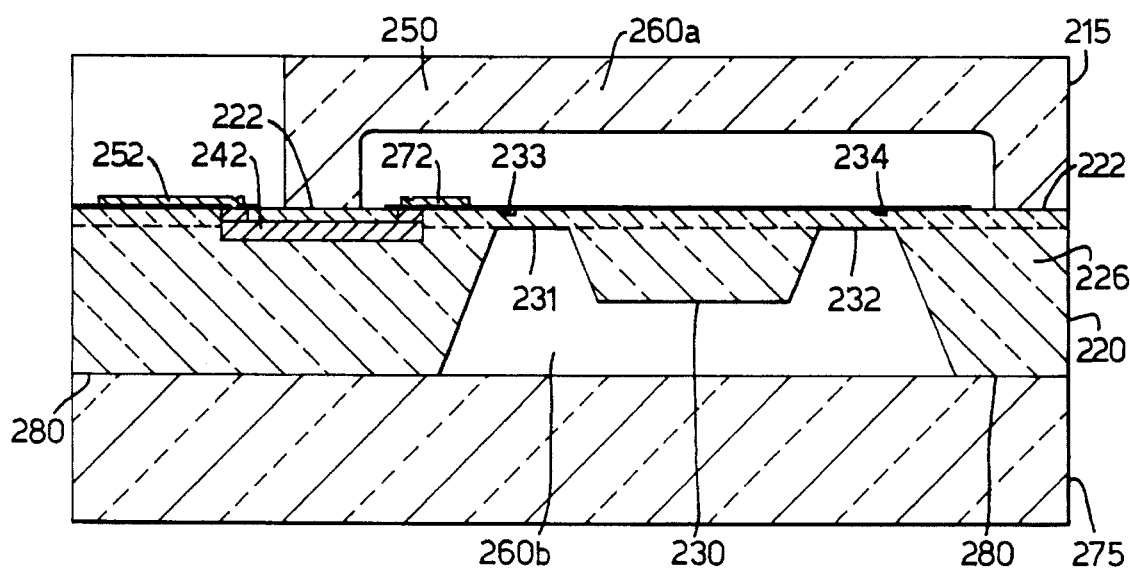
FIG. 14 shows a sectional view of the structure in FIG. 13 along line $Y_{14}$–$Y_{14'}$.

The universal properties of the present invention can be shown by explaining a second example of an accelerometer built by using this method and as shown in FIG. 13 and 14. A silicon accelerometer structure with seismic mass-spring system built into a first silicon member 220 is shown as part of FIG. 14 and shown in plan view in FIG. 13 as resulting from processing of a first wafer with a central seismic proof mass 230 hanging on two spring members 231 and 232 suspended from a frame section of silicon substrate 226. Piezoresistive elements 233 and 234 are electrically connected to outside bonding pads and aluminium interconnections members 251, 252, 253 and 254 via aluminium interconnection members 271, 272, 273 and 274 and buried diffused conductor crossings 241, 242, 243 and 244. Glass members 215 and 275 as seen in FIG. 14 are anodically bonded to each side of the silicon member 220 at interface areas 222 and 280, thus forming a completely sealed cavity 260a and 260b around the seismic mass-spring system 230, 231, 232 of the accelerometer of said glass member 215. The distance between the proof-mass 230 and lid part 250 of said glass member 215 and/or the distance between the proof-mass 230 and the bottom glass member 275 can be used for mechanical overload protection of the travel of the proof-mass in mechanical shock situations and/or for squeezefilm damping by using a controlled atmosphere in the cavity. The FIGS. 13 and 14 show a piezoresistive accelerometer with a half-bridge having resistors 233 and 234. It is obvious that resonant structures can be integrated and connected in the same way hereby making an accelerometer with resonant structure as detection principle.

In the same way the present invention can be used for a large variety of functional devices which are to be sealed inside a cavity of controlled atmosphere or vacuum. Thus, such functional devices could e.g. be connected in a manner known per se to contact areas inside the cavity, whether or not a diaphragm or spring-mass system is used.

What is claimed is:

1. A method for providing a sealed cavity means coactively with the surface of a silicon wafer forming a substrate and with electrically insulated conductor means across a sealing area formed between a lid means defining part of said cavity means and said wafer surface to connect functional device means inside said cavity means to electrical terminals outside said cavity means, comprising:

a) providing an N type single silicon crystal substrate, b) carrying out a photomask step in which buried conductors are formed by ion to implantation of boron, using a photoresist on top of said substrate as a mask layer, followed by a drive-in diffusion step, in order to provide surface doping of insulated P-type areas for said conductors and without any steps in the substrate surface at the location of PN junctions thus provided, c) growing an epitaxial N type layer on top of said buried conductors and said top of said substrate adjacent said conductors to provide for said conductors being buried into single crystal silicon to be protected from surface effects, d) forming P type contacts extending from the top level of said epitaxial layer down to each end of said buffed P type conductors by a photomasking and doping step, e) providing a passivation layer on top of said epitaxial layer and and said contacts, f) providing said functional device means and electrically connecting said functional device means to said contacts, g) providing said lid means over said functional device means and part of said wafer surface, thereby positioning at least part of a rim of said lid means to lie above said buried conductors, h) positioning said silicon wafer substrate and said lid means in a mutually aligned state on heating means, i) applying an electric field between said wafer substrate and said lid means, j) heating the combined wafer substrate and lid means structure to an elevated temperature to cause positive ions in said lid means to be mobile and drift under the influence of said electric field towards interface at said wafer substrate to create an electrostatic force which pulls said wafer substrate and said lid means together to atomic level intimate contact, and k) cooling said combined structure to immobilize said ions to maintain at least part of said electrostatic force and bond said wafer substrate and said lid means together, and removing said applied electric field.

2. A method according to claim 1, wherein said lid means is a preshaped member of glass.

3. A method according to claim 1, wherein said lid means is a preshaped member of silicon having on a cavity side and contact region side thereof a sputter deposited glass film.

4. A method according to claim 1, wherein said elevated temperature is in a range of 300–450 degC.

5. A method according to claim 1, wherein said step d) further includes patterning and doping piezoresistive elements in said epitaxial layer and providing P type element contacts to each end of said elements, and said step e) further including providing said passivation layer over said piezoresistive elements and said element contacts.

6. A method according to claim 5, wherein said step e) further includes making contact holes in said passivation layer down to said conductor contacts and said element contacts.

7. A method according to claim 6, wherein said step f) includes providing metal interconnection members to contact said conductor contacts and said element contacts through said contact holes in said passivation layer.

8. A method according to claim 7, wherein a further step l) intermediate said steps f) and g) includes selectively etching away from the bottom side of said substrate a portion thereof to provide a diaphragm portion below at least one of said piezoresistive elements.

9. A method according to claim 8, wherein said step g) further includes providing a bottom cover means covering the bottom portion of said substrate at least over the etched away portions thereof, and subjecting said bottom cover means to steps h–k) by positioning said silicon wafer substrate and said bottom cover means in a mutually aligned state on said heating means, applying a further electric field between said wafer substrate and said bottom cover means, heating the combined wafer substrate, lid means and bottom cover means structure to an elevated temperature to cause in addition positive ions in said bottom cover means to be mobile and drift under the influence of said further electric field towards interface at said wafer substrate to create an electrostatic force which pulls said wafer substrate and said bottom cover means together to atomic level intimate contact, and cooling said combined structure to immobilize said ions to maintain at least part of said electrostatic force and bond said wafer substrate and bottom cover means together, and removing said further applied electric field.

10. A method according to claim 7, wherein a further step m) intermediate said steps f) and g) includes selectively etching away from the bottom side of said substrate a portion thereof to create first and second thinned portions of a first thickness and a third portion intermediate said first and second thinned portions and having a second greater thickness, and further etching away through a remaining part of said substrate, said epitaxial layer and said passivation layer spaced apart sections of said first, second and third portions to create a seismic mass-spring structure, said first and second portions forming the springs thereof and said third portion forming a central seismic proof mass, said piezoresistive elements being located on said mass-spring structure.

11. A method according to claim 10, wherein said piezoresistive elements are located on said first and second thinned portions.

12. A method according to claim 10, wherein said step g) further includes providing a bottom cover means covering the bottom portion of said substrate at least over the etched away portions thereof, and subjecting said bottom cover means to steps h–k) by positioning said silicon wafer substrate and said bottom cover means in a mutually aligned state on said heating means, applying a further electric field between said wafer substrate and said bottom cover means, heating the combined wafer substrate, lid means and bottom cover means structure to an elevated temperature to cause in addition positive ions in said bottom cover means to be mobile and drift under the influence of said further electric field towards interface at said wafer substrate to create an electrostatic force which pulls said wafer substrate and said bottom cover means together to atomic level intimate contact, and cooling said combined structure to immobilize said ions to maintain at least part of said electrostatic force and bond said wafer substrate and bottom cover means together, and removing said further applied electric field.

13. A method according to claim 12, wherein said bottom cover means is a preformed slab of glass.

14. A method according to claim 1, wherein said step e) further includes making contact holes in said passivation layer down to said conductor contacts.

15. A method according to claim 12, wherein said step f) includes providing metal interconnection members to contact said conductor contacts through said contact holes in said passivation layer.

16. A method according to claim 1, wherein said silicon wafer substrate and said lid means are of sub-dividable into multi-chips.

17. A method according to claim 9, wherein said silicon wafer substrate, said lid means and said bottom cover means are of sub-dividable into multi-chips.

18. A method according to claim 12, wherein said silicon wafer substrate, said lid means and said bottom cover means are of sub-dividable into multi-chips.

* * * * *

UNITED STATES PATENT AND TRADEMARK OFFICE
CERTIFICATE OF CORRECTION

PATENT NO.  : 5,591,679
DATED       : January 7, 1997
INVENTOR(S) : Henrik Jakobsen et al.

It is certified that error appears in the above-indentified patent and that said Letters Patent is hereby corrected as shown below:

In column 8, line 36, delete "to";
             line 49, change "buffed" to --buried--.

Signed and Sealed this

Tenth Day of June, 1997

BRUCE LEHMAN

Attest:

Attesting Officer

Commissioner of Patents and Trademarks